United States Patent
Jackson et al.

(10) Patent No.: US 6,366,620 B1
(45) Date of Patent: Apr. 2, 2002

(54) VSAT SYSTEM

(75) Inventors: Thomas Jackson, Frederick; David Bourner, Silver Spring; Hai Tang, Olney; Mohammad N. Bukhari, Germantown, all of MD (US); Robert Hannah, Camarillo, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/657,705

(22) Filed: Sep. 8, 2000

Related U.S. Application Data (63) Continuation-in-part of application No. 08/895,445, filed on Jul. 15, 1997, now Pat. No. 6,122,326, which is a continuation of application No. 08/354,293, filed on Dec. 13, 1994, now abandoned.

(51) Int. Cl.[7] .......................... H04L 27/20; H03C 3/00; H04B 7/185
(52) U.S. Cl. ...................... 375/308; 375/307; 332/127; 332/145; 455/12.1
(58) Field of Search ................................. 375/279, 281, 375/284, 295, 296, 297, 306, 307, 308; 332/103, 104, 127, 144; 455/76, 12.1, 86

(56) References Cited

U.S. PATENT DOCUMENTS

| | | |
|---|---|---|
| 3,644,831 A | 2/1972 | Latker et al. |
| 3,815,029 A | 6/1974 | Wilson |
| 3,993,868 A | 11/1976 | Balcewicz |

(List continued on next page.)

FOREIGN PATENT DOCUMENTS

| | | |
|---|---|---|
| DE | 43 20 087 C1 | 8/1994 |
| EP | 0 454 917 A1 | 6/1991 |

OTHER PUBLICATIONS

"Quarternary Transmission Over Satellite Channels With Cascaded Nonlinear Elements and Adjacent Channel Interference", Russell J. F. Fang, IEEE, vol. Com–29, No. 5, May 1981, pp. 567–581.

"MSK and Offset QPSK Signal Transmissions Through Nonlinear Satellite Channels in the Presence of Intersymbol Interference", N. Ekanayake, IEEE Proceedings, vol. 130, Part F, No. 6, Oct. 1983, pp. 513–518.

"Effect of Nonlinear Amplifiers of Transmitters in the CDMA System Using Offset–QPSK", Manabu Sawada, et al, IEICE Trans. Commun., vol. E76–B, No. 7 Jul. 1993, pp. 741–744.

"Experimental Results on Constant Envelope Signaling With Reduced Spectral Sidelobes", Frank Amoroso, International Conference on Communications, Jun. 14–18 1981, pp. 47.1.1–47.1.5.

(List continued on next page.)

Primary Examiner—Young T. Tse
(74) Attorney, Agent, or Firm—John T. Whelan; Michael W. Sales (57) ABSTRACT

A VSAT system for generating and transmitting a modulated data signal to a satellite. The VSAT system includes an indoor unit for generating a modulated data signal having an envelope of constant amplitude, and an outdoor unit including a transmitter module operative to receive the modulated data signal and to frequency multiply and amplify the modulated data signal so as to produce a modulated carrier signal having an envelope of constant amplitude. The transmitter module includes a multiplier operative to frequency multiply the modulated data signal to the frequency of the modulated carrier signal, and a power amplifier operated in the saturation mode, which amplifies the modulated carrier signal to the desired power level. The components constituting the transmitter module are formed on a single integrated circuit.

52 Claims, 5 Drawing Sheets

U.S. PATENT DOCUMENTS

| | | | |
|---|---|---|---|
| 4,216,542 A | * | 8/1980 | Hermesmeyer ............. 375/308 |
| 4,313,205 A | | 1/1982 | Rhodes |
| 4,324,001 A | | 4/1982 | Rhodes |
| 4,355,404 A | | 10/1982 | Uzunoglu |
| 4,449,250 A | * | 5/1984 | Kurby ......................... 455/76 |
| 4,513,447 A | * | 4/1985 | Carson ........................ 455/76 |
| 4,751,478 A | | 6/1988 | Yoshida |
| 4,755,774 A | | 7/1988 | Heck |
| 4,930,141 A | | 5/1990 | Ohmagari |
| 5,095,539 A | | 3/1992 | Leveque |
| 5,128,633 A | | 7/1992 | Martin et al. |
| 5,309,479 A | * | 5/1994 | Cheah ........................ 375/303 |
| 5,353,311 A | | 10/1994 | Hirata et al. |
| 5,412,351 A | | 5/1995 | Nystrom et al. |
| 5,412,352 A | | 5/1995 | Graham |
| 5,424,688 A | | 6/1995 | Phillips |
| 5,434,887 A | | 7/1995 | Osaka |
| 5,467,373 A | | 11/1995 | Ketterling |
| 5,495,202 A | | 2/1996 | Hsu |
| 5,502,745 A | | 3/1996 | Williams et al. |
| 5,559,475 A | * | 9/1996 | Fukuyama ................... 331/31 |
| 5,586,146 A | * | 12/1996 | Fang et al. ................. 375/295 |
| 5,589,837 A | * | 12/1996 | Soleimani et al. .......... 342/359 |
| 5,678,210 A | * | 10/1997 | Hannah ...................... 455/128 |
| 5,774,788 A | * | 6/1998 | Hannah et al. ............. 455/12.1 |
| 5,819,161 A | | 10/1998 | Saito |
| 5,825,257 A | * | 10/1998 | Klymyshyn et al. ........ 332/100 |
| 5,894,592 A | * | 4/1999 | Brueske et al. ............... 455/86 |
| 5,995,812 A | * | 11/1999 | Soleimani et al. ........... 455/119 |
| 6,018,275 A | * | 1/2000 | Perrett et al. ............... 332/127 |
| 6,125,266 A | * | 9/2000 | Matero et al. .............. 455/126 |

OTHER PUBLICATIONS

"Modem Design Using Continuous Phase Modulation With Coding", Carl Ryan, 1985 IEEE Military Communications Conference, Oct. 20–23, 1985, pp. 11.5.1–11.5.6.

"The Effects of Filtering and Limiting A Double–Binary PSK Signal", Robert K. Kwan, IEEE Transactions on Aerospace and Electronic Systems, vol. AES–5, No. 4, Jul. 1969, pp. 589–594.

"VSAT Networks", G. Maral, pp. 27–33.

Amati, M. et al., "Low Noise Agile Microwave Frequency Synthesizer for Satellite Communications" 19$^{th}$ European Microwave Conference, Sep. 4–7, 1989, London, pp. 561–566.

* cited by examiner

VSAT SYSTEM

This application is a continuation-in-part of U.S. patent application Ser. No. 08/895,445 filed on Jul. 15, 1997, now U.S. Pat. No. 6,122,326, which is a continuation of U.S. patent application Ser. No. 08/354,293 filed on Dec. 13, 1994 (now abandoned).

BACKGROUND OF THE INVENTION

Satellite communication systems typically have employed large aperture antennas and high power transmitters for establishing an uplink to the satellite. Recently, however, very small aperture antenna ground terminals, referred to as remote ground terminals, have been developed for data transmission. In such systems, the remote ground terminals, also known as VSATs, are utilized for communicating via a satellite from a remote location to a central hub station. The central hub station communicates with multiple remote ground terminals, and has a significantly larger antenna, as well as a significantly larger power output capability than any of the remote ground terminals.

As stated, very small aperture terminals (VSATs) can be used to communicate data, voice and video, to or from a remote site to a central hub. Typically, the VSAT terminals have a small aperture directional antenna for receiving from or transmitting signals to the satellite, and an outdoor unit (ODU) mounted near the antenna for transmitting a modulated carrier generated by an indoor unit (IDU). The IDU demodulates incoming signals received from the ODU and also operates as an interface between a user's communication equipment and the ODU.

The viability of the remote ground terminal concept increases as the cost for providing a remote ground terminal at the remote location decreases. In pursuit of this objective, various techniques have been utilized to reduced the cost of the remote ground terminal. For example, U.S. Pat. No. 5,208,829 describes a spread spectrum technique that maximizes the power output from a satellite so as to allow a cost saving reduction in the size of the antenna of the remote ground terminal. U.S. Pat. No. 5,309,479 describes a remote ground terminal comprising a low cost transmitter for producing an FSK (frequency-shift keying) modulated uplink signal which is utilized to communicate with the central hub station via the satellite.

Notwithstanding these cost saving techniques, problems remain in prior art VSAT systems. For example, in prior art systems, which modulate an intermediate frequency signal and then up-convert the signal to a carrier frequency, the frequency deviation or error is also multiplied by the same factor as the frequency, which can be on the order of 100 or greater. As a result, the frequency of the modulated carrier signal is susceptible to undesirable variations.

Furthermore, typically, the outdoor unit contains circuitry for generating a vector modulated data signal, including linear upconverters for frequency converting the modulated data signal to the required transmit frequency and a linear power amplifier for amplifying the modulated data signal prior to transmission via the antenna. Such circuitry presents numerous drawbacks, for example, the generation of spurious signals in the outdoor unit which operate to increase the noise component of the output signal transmitted to the satellite.

Accordingly, there exists the need for a VSAT system comprising an indoor unit and an outdoor unit, which eliminates the foregoing problems.

SUMMARY OF THE INVENTION

The present invention relates to a VSAT system comprising both an indoor unit and an outdoor unit, which solves the foregoing problems. More specifically, the VSAT system of the present invention comprises an indoor unit having a novel synthesizer/modulator design which allows for the modulation and frequency multiplication of an intermediate frequency signal without a corresponding increase in the frequency deviation or phase noise of the signal. In addition, the present invention provides a novel design for the outdoor unit which eliminates the need for the transmitter module to contain a linear upconverter or a linear power amplifier, so as to substantially reduce the overall cost of the remote ground terminal relative to prior art designs. The design of the transmitter module also minimizes the outdoor unit's sensitivity to changes in temperature.

In an exemplary embodiment the indoor unit comprises a vector modulator for phase-modulating an input information signal so as to produce a phase-modulated signal; a first frequency divider circuit coupled to the output of the vector modulator, which is operative for reducing the frequency and frequency deviation of the phase-modulated signal, and for generating an output signal having an envelope of constant amplitude; and a mixer coupled to the first frequency divider, which is operative for frequency translating the phase-modulated signal and outputting a modulated data signal. The outdoor unit comprises a phase-locked loop coupled to a transmitter module. The phase-locked loop and the transmitter module operate to receive the modulated data signal and to frequency multiply and amplify the modulated data signal so as to produce a modulated carrier signal having an envelope of constant amplitude.

As described below, the VSAT system of the present invention provides important advantages over prior art devices. For example, by downconverting the modulated reference signal output by the modulator, the frequency deviation of the modulated reference signal is also reduced by the same factor. Accordingly, inexpensive modulators operating in the microwave region can be utilized. Without such down-conversion, upon completing the upconversion process, the frequency deviation of the modulated reference signal would exceed the frequency deviation rating of the modulator.

Furthermore, the down-conversion of the modulated reference signal also provides the added benefit that any error in the I/Q balance of the input data signals to the modulator is also reduced by the same factor.

In addition, the design of the transmitter module of the present invention results in an increase in operational efficiency of the outdoor unit, a reduction in overall size of the outdoor unit and a reduction in DC power consumption by the outdoor unit, which substantially lowers the cost of the outdoor unit of the present invention.

The invention itself, together with further objects and attendant advantages, will best be understood by reference to the following detailed description, taken in conjunction with the accompanying drawings.

DETAILED DESCRIPTION OF THE DRAWINGS

Figure 1:
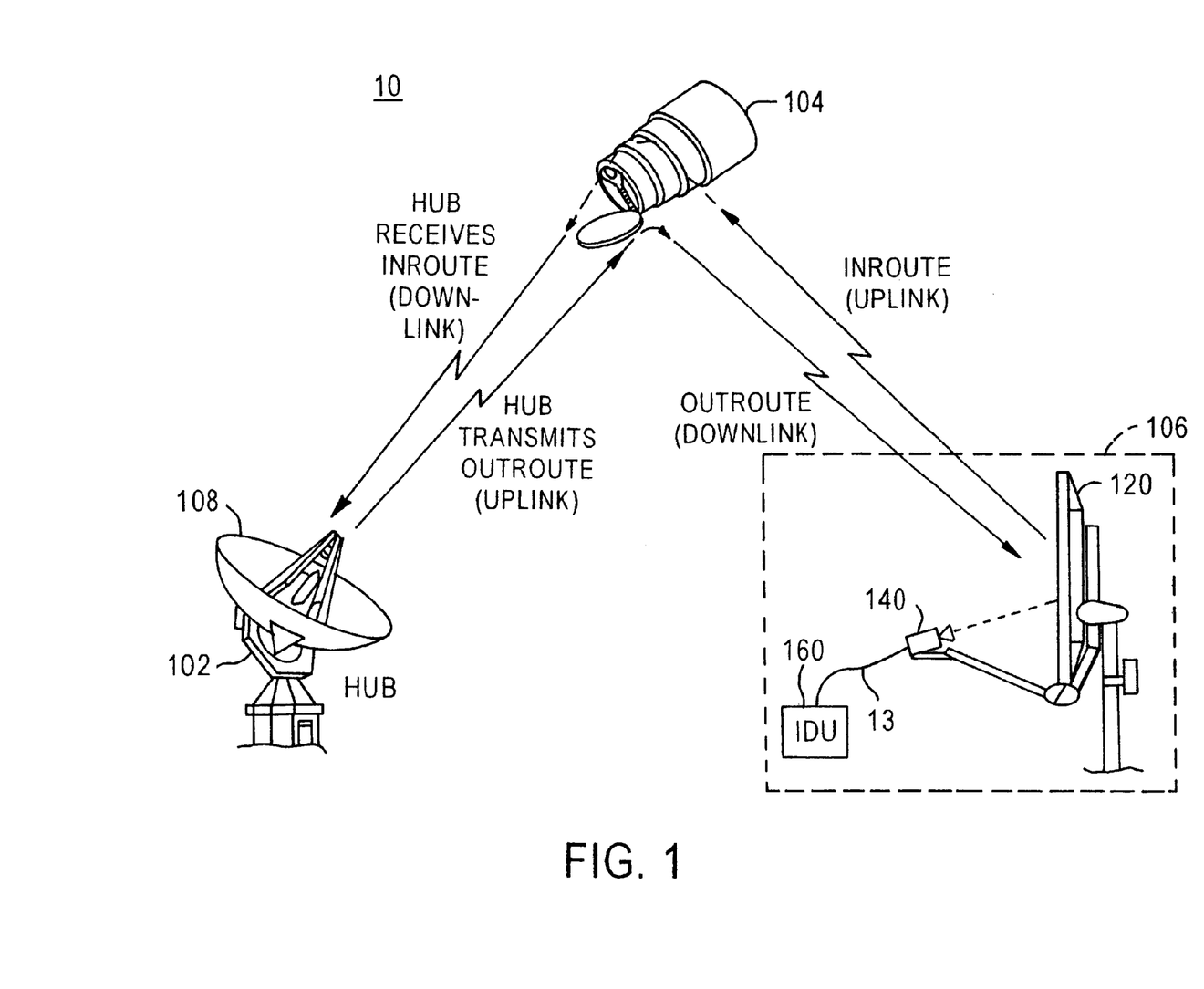
FIG. 1 is a block diagram of a very small aperture terminal ("VSAT") satellite communication network which utilizes the present invention.

The VSAT satellite communication network 10 illustrated in FIG. 1, comprises a central hub station 102, a communication satellite 104, and a plurality of remote ground terminals 106 (only one is shown). The VSAT network 10 functions as a two way transmission system for transferring data and voice communications between the central hub station 102 and the numerous remote ground terminals 106. All data is transferred between the central hub station 102 and the remote ground terminals 106 via transponders located in the satellite 104.

As stated, the central hub station 102 supports a plurality of remote ground terminals 106. The central hub station 102 comprises a large antenna 108 so as to allow for the transmission of a signal sufficiently strong such that the signal can be received by the remote ground terminals 106 which have relatively small antennas. The large antenna 108 of the central hub station 102 also compensates for the relatively weak signals transmitted by the remote ground terminals 106.

As shown in FIG. 1, the communication satellite 104 functions as a microwave relay. It receives signals from both the central hub station 102 and the remote ground terminals 106 at a first frequency and then retransmits the signal at a second frequency. The satellite 104 comprises a transponder which receives, amplifies and retransmits each signal within a predefined bandwidth. The transponders of the VSAT network 10 shown in FIG. 1 can operate in various frequency bands, for example, Ku and C band.

The remote ground terminal 106 comprises a small aperture antenna 120 for receiving (i.e., downlink) and transmitting (i.e., uplink) signals, an outdoor unit 140 typically mounted proximate the antenna 120 which comprises a transmitter module for amplifying and frequency multiplying a modulated data signal which is coupled to the antenna 120, and an indoor unit 160 which operates as an interface between a specific user's communication equipment and the outdoor unit 140. The indoor unit 160 also generates the modulated data signal which is amplified and frequency multiplied by the transmitter module of the outdoor unit. On/off control circuitry can also be incorporated to allow the ODU to operate in a burst mode/time division multiple access (TDMA) mode.

During normal operation, the indoor unit 160 receives data from the user's equipment (not shown in FIG. 1) and modulates a reference signal in accordance with this data so as to produce the modulated data signal. As explained below, the modulation scheme utilized is preferably such that the modulated data signal comprises an envelope having a constant amplitude. This modulated data signal is then transferred to the outdoor unit 140. The transmitter module of the outdoor unit 140 functions to amplify and frequency multiply the modulated data signal so as to produce a modulated carrier signal. The modulated carrier signal is then coupled to the antenna 120 via a waveguide and feedhorn, and then transmitted to the satellite 104. Upon receipt by the central hub station 102, the modulated carrier signal is demodulated such that the data transmitted from the remote user is reproduced and processed by the central hub station 102.

In the preferred embodiment, the indoor unit 160 also supplies the outdoor unit 140 with a DC power signal and a carrier on/off signal. Both of these signals are multiplexed with the modulated data signal and transferred to the outdoor unit 140 as a single signal via an interfacility link 13, which in the preferred embodiment is a single cable.

Figure 2:
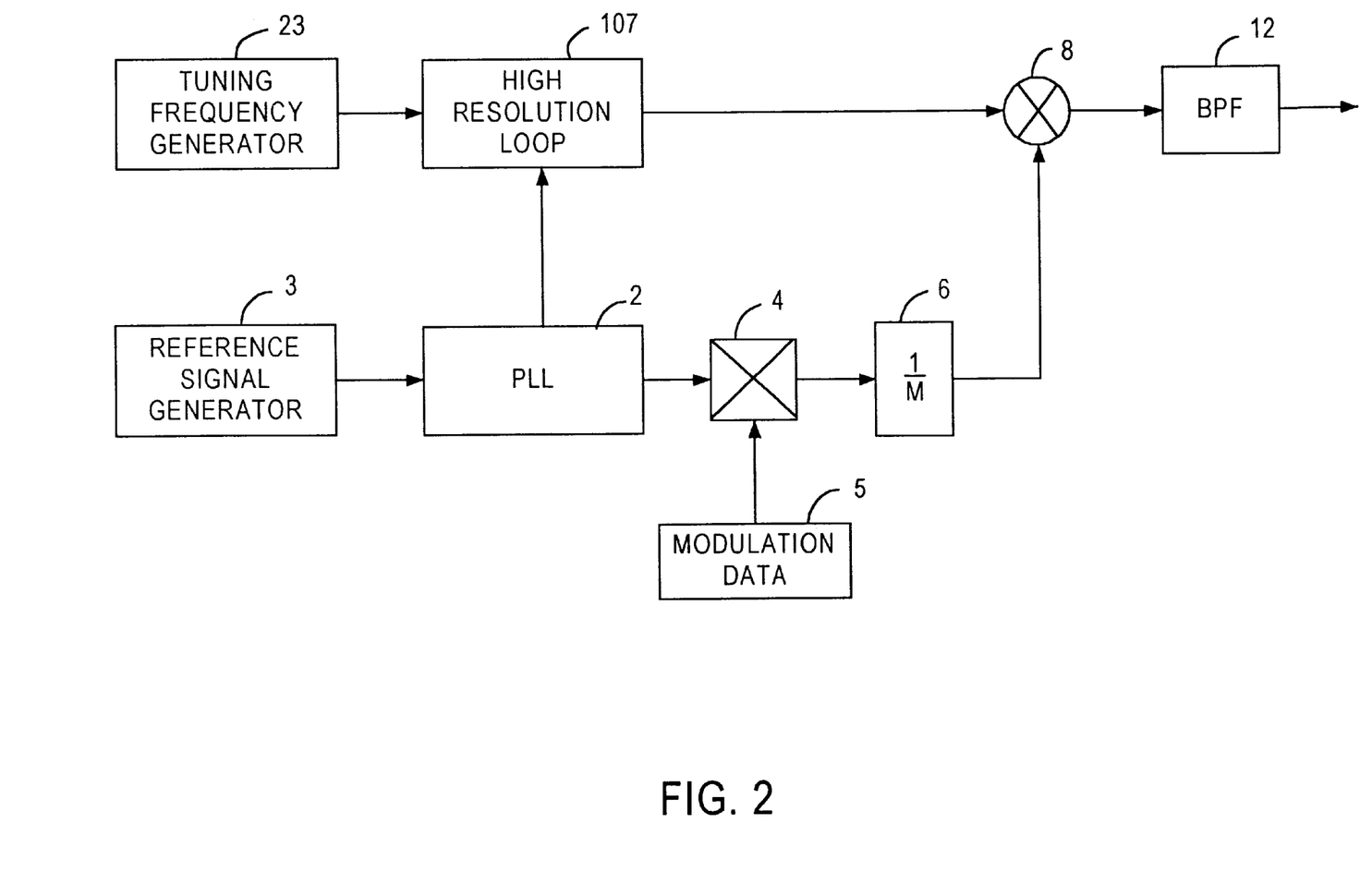
FIG. 2 is a block diagram of an exemplary embodiment of the synthesizer/modulator contained in the indoor unit of the VSAT system of the present invention.

Referring to FIG. 2, the synthesizer/modulator of the indoor unit comprises a first phase-locked loop 2 having an input port for receiving a reference signal 3 from a local oscillator, or equivalent thereof, and an output port which is coupled to an input port of a modulator 4. The first PLL 2 functions to frequency multiply the reference signal 3 to a predetermined frequency.

The modulator 4, for example, a quadrature or phase modulator, receives modulation data 5 to be superimposed on the up-converted reference signal generated by the first PLL 2. The modulated reference signal generated by the modulator 4 exhibits full scale frequency deviation in accordance with the frequency deviation rating of the modulator 4.

It is noted that the modulation data 5 represents the information to be transmitted. The type of modulation data 5 input to the modulator 4 varies in accordance with the modulation scheme being utilized. For example, if the modulation scheme utilized is quadrature phase shift keying "QPSK," the modulator 4 would be a QPSK modulator and the modulation data 5 input into the modulator 4 could be a serial data stream. Of course, other types of modulation schemes, for example, but not limited to, MSK, OQPSK and CPFSK. In the preferred embodiment, the modulator produces a signal having an envelope of constant amplitude.

The modulated reference signal is coupled to a frequency divider 6, which down-converts the modulated reference signal by a predetermined factor M. However, along with the reduction in frequency, the frequency divider 6 reduces the frequency deviation of the modulated reference signal by a factor of M. The output of the frequency divider 6 is coupled to one input of a mixer 8. In addition, in the preferred embodiment, the output of the frequency divider 6 is a signal having an envelope of constant amplitude.

As explained in greater detail below, the other input to the mixer 8 is coupled to the output of a high resolution tunable signal generator 107 comprising a DDS 22 and a second PLL 26 which utilizes frequency translation in the feedback loop (neither the DDS 22 or the PLL 26 are shown in FIG. 1). The tunable signal generator 107 is desirable so as to allow for various techniques, such as, frequency division multiple access ("FDMA") which is utilized in cellular systems.

The output of the mixer 8 is coupled to a bandpass filter 12 so as to select either the upper or lower sideband of the resultant signal. As a result, the signal present at the output of the bandpass filter 12 exhibits low phase noise and a frequency deviation which is less than the frequency deviation of the modulator 4.

Further, the first PLL 2 provides a reference signal 25 which is coupled to the DDS 22 of the signal generator 107 via a frequency/divider 24. As explained below, the reference signal 25 functions as a stable local oscillator as required by the operation of the DDS 22.

Advantageously, the design of the modulator/synthesizer of the indoor unit allows for the use of inexpensive modulators 4, for example, the ATT W2010 I/Q modulator, which produces a modulated signal having both amplitude and phase modulation. As explained above, the frequency deviation of the modulated signal is reduced by frequency dividing the modulated signal prior to up-converting the signal to the carrier frequency. If the factor by which the modulated signal is reduced is greater than the factor by which the modulated signal is subsequently Increased to produce the carrier signal, the frequency deviation of the modulated carrier signal will remain less than the full scale deviation of the modulator 4.

Advantageously, the design of the modulator/synthesizer of the indoor unit allows for the use of inexpensive modulators 4, for example, the ATT W2010 I/Q modulator. As explained above, the frequency deviation of the modulated signal is reduced by frequency dividing the modulated signal prior to up-converting the signal to the carrier frequency. If the factor by which the modulated signal is reduced is greater than the factor by which the modulated signal is subsequently increased to produce the carrier signal, the frequency deviation of the modulated carrier signal will remain less than the full scale deviation of the modulator 4.

Accordingly, in the preferred embodiment, the design of the synthesizer/modulator of the present invention utilizes two feedback loops to generate the low phase noise, high precision, modulated signal. The first loop comprises the high resolution tunable signal generator 107, which utilizes the DDS 22 to precisely set the frequency of the signal to be transmitted, and a second PLL 26 utilizing frequency translation, which raises the frequency of the signal generated by the DDS 22 without raising the phase noise or the spurious frequency components of the signal output by the DDS 22.

Figure 3:
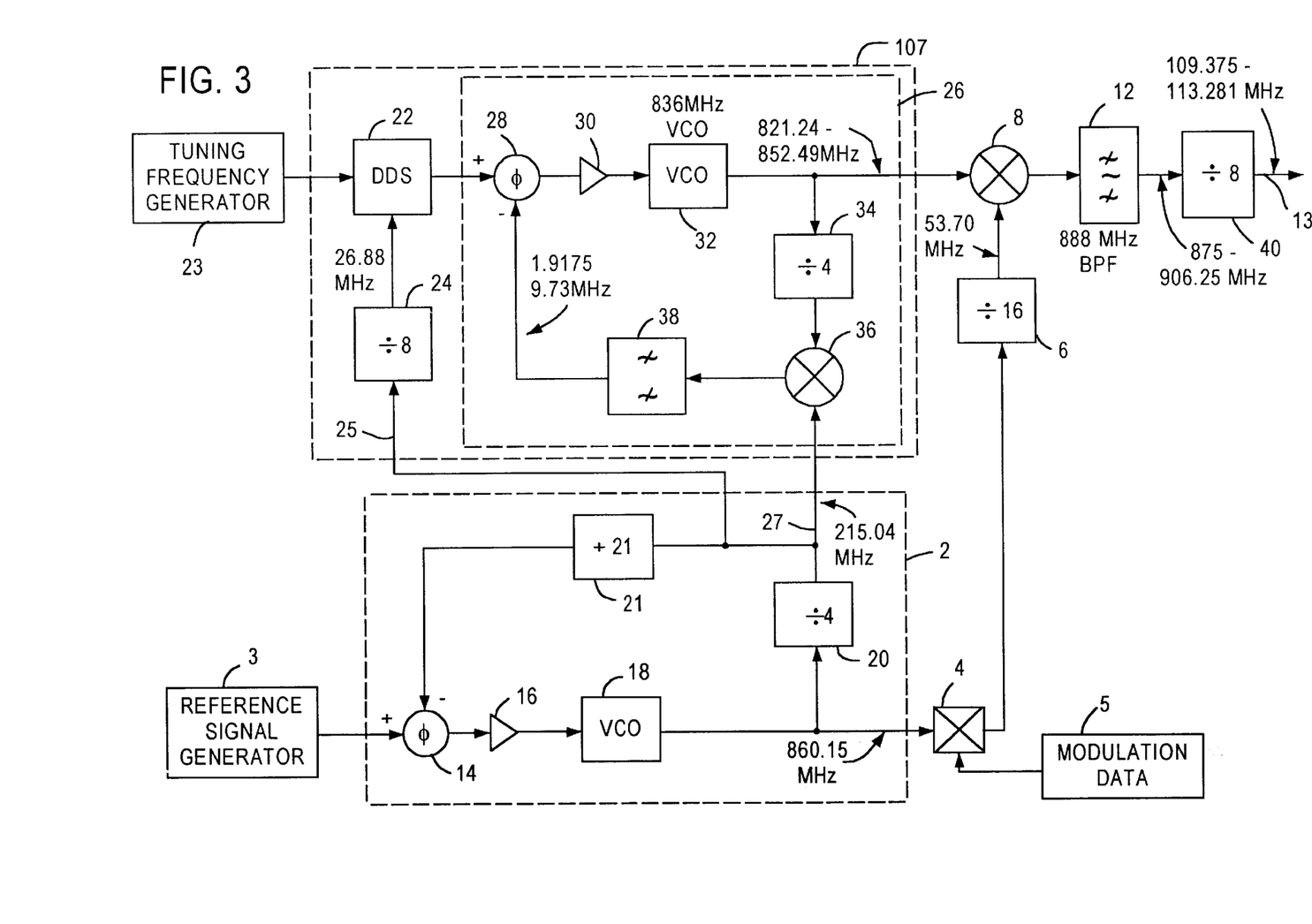
FIG. 3 is a schematic diagram of one embodiment of the synthesizer/modulator illustrated in FIG. 2.

The second loop comprises the first PLL 2, the phase modulator 4 and the frequency divider 6, and functions to produce a modulated signal having a frequency deviation which is less than the frequency deviation of the phase modulator 4. Referring to FIG. 3, the first PLL 2 is a standard phase-locked loop comprising a phase detector 14 having one input for receiving a 10.24 MHz reference signal, which is generated, for example, by a local oscillator, a low pass filter 16 coupled to the output of the phase detector 14, a voltage controlled oscillator ("VCO") 18 coupled to the output of the low pass filter 16, a first frequency divider 20 coupled to the output of the VCO 18, and a second frequency divider 21 coupled to the output of the first frequency divider 20. The output of the second frequency divider 21 is coupled to a second input of the phase detector 14 so as to complete the feedback network of the first PLL 2.

As shown in FIG. 3, the first frequency divider 20 divides the output of the VCO 18 by a factor of 4 to produce a 215.04 MHz reference signal, and the second frequency divider 21 divides this signal by a factor of 21 so as to produce a reference signal having a frequency of 10.24 MHz.

As stated above, the output of the first PLL 2, which is a 860.16 MHz reference signal taken at the output of the VCO 18, is coupled to the input of the modulator 4. The modulator 4 receives modulation data 5 and produces a phase modulated signal having a constant amplitude. Acceptable modulation schemes include, for example, minimum shift keying ("MSK") modulation. The phase modulated signal output by the modulator 4 also exhibits full scale frequency deviation (i.e., the maximum frequency deviation as rated by the modulator specification).

The output of the modulator 4 is coupled to the frequency divider 6 which reduces the frequency of the modulated signal and the frequency deviation by a factor of 16 to produce a modulated reference signal having a frequency of 53.76 MHz. The output of the frequency divider 6 is coupled to one input of a mixer 8. The other input to the mixer 8 is provided by the output of the high resolution tunable signal generator 107. As stated above, preferably the signal output by the frequency divider 6 has an envelope exhibiting a constant amplitude.

The high resolution tunable signal generator comprises a DDS 22, for example, the HSP45102 produced by Harris Corp., having a first input for receiving a variable frequency signal 23 (i.e., tuning frequency) utilized to tune the output of the DDS 22 to the desired frequency, and a second input for receiving a reference signal 25. The reference signal 25 is generated by coupling the output of the first frequency divider 20 of the first PLL 2 to a frequency divider 24 which divides the signal by a factor of 8. The output of the frequency divider 24, which is 26.88 MHz reference signal, is coupled to the second input of the DDS 22. The output of the DDS 22, which is coupled to the input of the second PLL 26, is tunable in accordance with the variable frequency signal 23 and in the present embodiment is approximately 6 MHz.

The second PLL 26 comprises a phase detector 28 having one input for receiving the output signal from the DDS 22, a low pass filter 30 coupled to the output of the phase detector 28, a VCO 32 coupled to the output of the low pass filter 30, a frequency divider 34 coupled to the output of the VCO 32, a mixer 36 having one input port coupled to the output of the frequency divider 34, and a bandpass filter 38 coupled to the output of the mixer 36. The output of the bandpass filter 38 is coupled to a second input of the phase detector 28 so as to complete the second PLL 26. The second input port of the mixer 36 is coupled to the output of the first frequency divider 20 of the first PLL 2.

The operation of the high resolution tunable signal generator 107 is as follows. As stated, in the present embodiment, the output of the DDS 22 is tuned so as to generate a reference frequency of 6 MHz. The VCO 32 generates a signal having a nominal frequency of 837 MHz which is divided by a factor of 4 by the frequency divider 34. The resulting 209 MHz signal is then coupled to the mixer 36, which in conjunction with the 215.04 MHz signal input from the first PLL 2, frequency translates the 209 MHz signal to a nominal 6 MHz signal. This 6 MHz signal is then compared to the DDS 22 output signal in the phase detector 28 to close the loop.

By utilizing the frequency translation scheme in the feedback loop, a precisely tunable frequency reference is established that exhibits phase noise characteristics significantly less than that of a synthesizer utilizing a conventional phase-locked loop. Furthermore, the use of the frequency translation scheme minimizes the increase in the spurious frequency components generated by the DDS 22.

The output of the high resolution tunable signal generator 107 is coupled to the other input of mixer 8, which functions to produce a nominal 890 MHz modulated intermediate frequency signal having minimal phase noise and $\frac{1}{16}$ the frequency deviation produced by the modulator 4.

The modulated intermediate frequency signal output by the mixer 8 is coupled to an additional frequency divider 40 via bandpass filter 12. The frequency divider 40 further reduces the frequency of the signal and the frequency deviation by a factor of 8. The resulting signal having a nominal frequency of 111 MHz, is then coupled to the outdoor unit.

Figure 4:
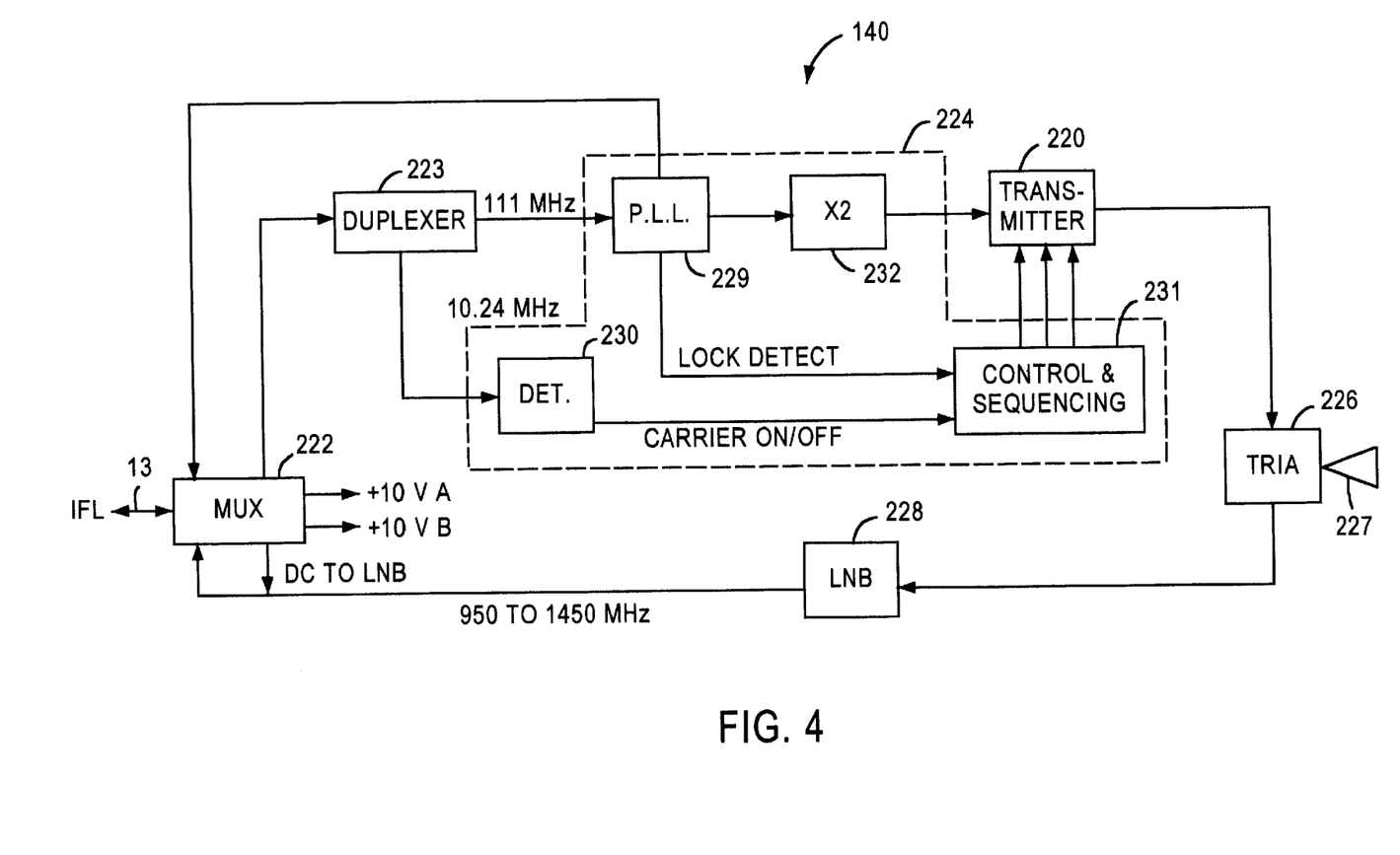
FIG. 4 is a block diagram illustrating an exemplary embodiment of the outdoor unit of the present invention.

FIG. 4 is a block diagram of an exemplary embodiment of the outdoor unit 140 of the present invention. As shown in FIG. 4, the outdoor unit 140 comprises a multiplexer 222 for receiving the modulated data signal from the indoor unit 160, a duplexer 223 for separating the modulated data signal and the carrier on/off signal received from the indoor unit 160, a main transmit module 224 for frequency stabilizing and multiplying the modulated data signal, a transmitter module 220 for amplifying and frequency multiplying the modulated data signal to generate a modulated carrier signal, and a transmit receive isolation assembly ("TRIA") 226. The output of the TRIA assembly 226 is coupled to the antenna 120 via a feedhorn 227. The antenna 120 then transmits the modulated carrier signal to the satellite 104.

The outdoor unit 140 also comprises a receiver chain for receiving the downlink signal from the satellite 104. The receiver chain comprises a low noise block downconverter 228 which transforms the received signal into a corresponding intermediate frequency signal. This signal is then coupled to the indoor unit 160, where it is further demodulated so as recreate the transmitted data. In one embodiment, the low noise block downconverter 228 comprises a low noise amplifier, and a mixer and local oscillator for downconverting the frequency of the received signal. The frequency of the local oscillator is selected in accordance with the desired frequency of the intermediate frequency signal.

The operation of the outdoor unit illustrated in FIG. 4 is as follows. As stated above, the multiplexer 222 of the outdoor unit 140 receives a multiplexed signal from the indoor unit 160. This multiplexed signal provides the modulated data signal having a frequency of approximately 111 MHz, DC power and the carrier on/off signal having a frequency of approximately 10.24 MHz. The multiplexer 222 couples the modulated data signal and the carrier on/off signal to the duplexer 223, and couples the DC power signal to the various components of the outdoor unit 140.

The duplexer 223 functions to separate the modulated data signal and the carrier on/off signal, and couple these signals to different components of the main transmit module 224 of the outdoor unit 140. As shown in FIG. 4, the modulated data signal is coupled to an input of a phase-locked loop 229, and the carrier on/off signal is coupled to a detector 230. In one embodiment, the duplexer 223 comprises a low pass filter and a high pass filter each of which receives the multiplexed signal from the multiplexer 222 as an input. The outputs of the low and high pass filters are coupled to the inputs of the detector 230 and the phase-locked loop 229, respectively.

The detector 230 functions to detect the presence or absence of the carrier on/off signal, and to produce an output signal if the carrier is presently being transmitted. In one embodiment, the detector 230 comprises an amplitude detector, for example, a diode detector, which produces a substantially level DC output signal when the carrier on/off signal is received by the detector 230. Other modulation techniques can be utilized to indicate the presence of the carrier signal. Of course, the detector 230 must be modified to detect the modulation technique utilized.

The output of the detector 230 is coupled to the control and sequencing unit 231. The control and sequencing unit 231 is coupled to the transmitter module 220 and functions to either enable or disable the transmitter module 220 in accordance with the presence or absence of the carrier on/off signal. In one embodiment, the control and sequencing unit 231 comprises a switch coupling the power supply with an input power line of the transmitter module 220. The switch comprises an input control port which is coupled to the output of the detector 230. Accordingly, if the detector 230 outputs a signal indicating the carrier on/off signal is present, the switch is enabled so that the input power line of the transmitter module 220 receives power and generates a modulated carrier signal which is subsequently transmitted to the satellite 104 via the antenna 120. Alternatively, if the detector output indicates the carrier on/off signal is not present, the switch is disabled so that transmitter module 220 does not receive power, thereby preventing the transmission of a modulated carrier signal.

As stated above, the 111 MHz modulated data signal output by the duplexer 223 is coupled to the input of the phase-locked loop 229 of the main transmit module 224. The phase-locked loop 229 is a standard phase-locked loop comprising, for example, a phase detector having one input for receiving the 111 MHz signal, a low pass filter coupled to the output of the phase comparator, a voltage controlled oscillator coupled to the output of the low pass filter, and a frequency divider coupled to the output of the voltage controlled oscillator. The output of the frequency divider is coupled to a second input of the phase detector so as to complete the loop. The output of the phase-locked loop 229 is taken from the output of the voltage controlled oscillator.

In one embodiment, the frequency divider is selected such that phase-locked loop 229 multiplies the frequency of the 111 MHz signal by approximately a factor of 16 so as to produce a data modulated signal of a first intermediate frequency. This signal is then coupled to a frequency multiplier 232 which multiplies the signal by a factor of 2. In one embodiment, the frequency multiplier 232 comprises any suitable frequency multiplier circuit, for example, but not limited to, a gallium arsenide FET coupled to a bandpass filter which is tuned to the second harmonic of the first intermediate frequency signal, or a comparable circuit utilizing bipolar transistors. The output of the frequency multiplier 232 is coupled to the input of the transmitter module 220.

The phase-locked loop 229 also comprises means for disabling the transmitter module 220. Specifically, if the phase-locked loop 229 does not receive the 111 MHz frequency or receives a signal having an improper frequency, which can be detected by monitoring the output level of the phase comparator, the phase-locked loop 229 produces an output signal, referred to as a lock detect signal. The lock detect signal, which for example can be a TTL logic signal, is coupled to the control and sequencing unit 231.

As with the output of the detector 230, the lock detect signal functions to control a switch in the control and sequencing unit 231, which either couples or isolates the transmitter module 220 from the power supply. Specifically, if the lock detect signal is present (e.g. logic high) the input power line of the transmitter module 220 is coupled to the power supply and therefore generates a modulated carrier signal. If the lock detect signal is not present (e.g. logic low) indicating the phase-locked loop 229 has lost lock, the input power line of the transmitter module 220 is isolated from the power supply and therefore disabled. In one embodiment, the control and sequencing unit 231 comprises an AND gate which receives the lock detect signal and the signal output by the detector 230 as inputs. The output of the AND gate is then coupled to the input of the switch coupling the input power line of the transmitter module 230 to the power supply.

Figure 5:
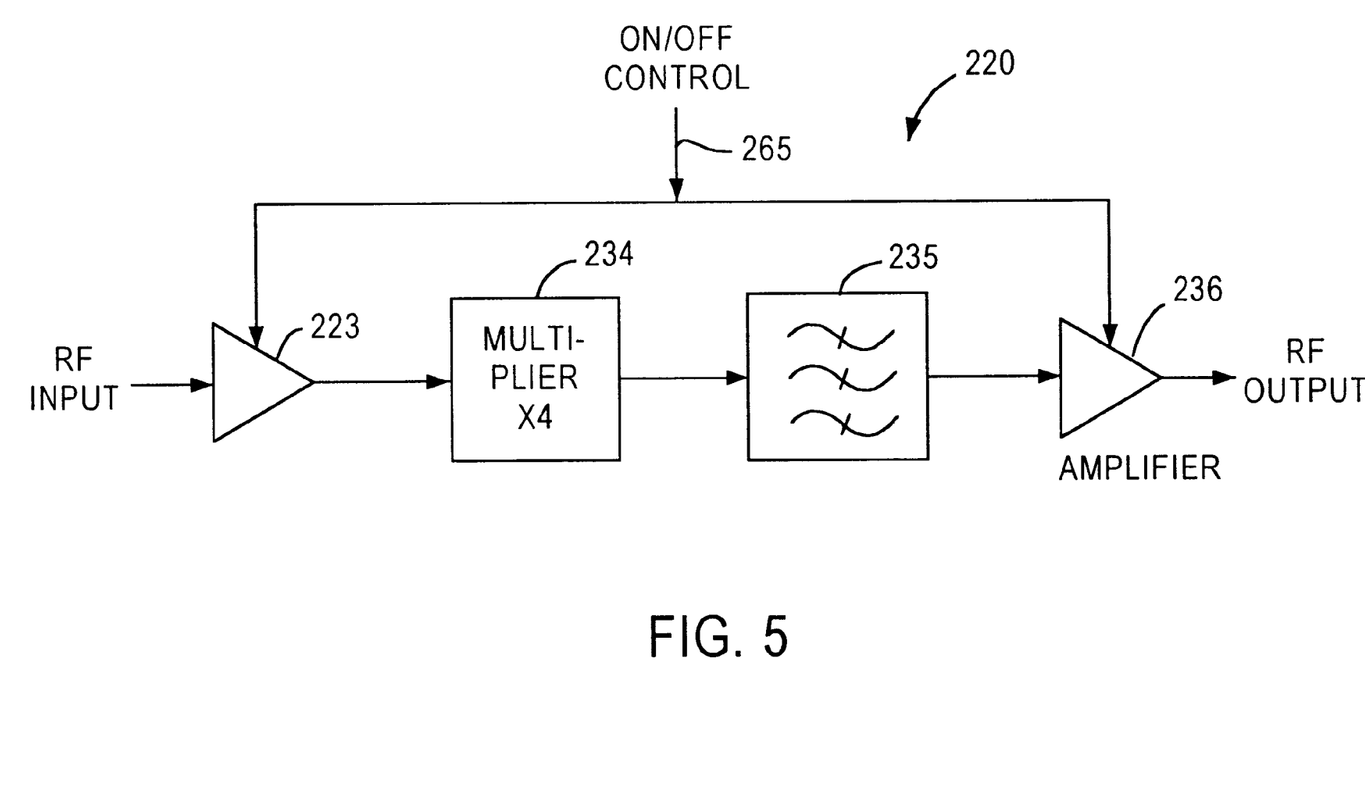
FIG. 5 is a block diagram illustrating the components of the exemplary embodiment of the transmitter module shown in FIG. 4 of the present invention.

As stated, the input of the transmitter module 220 is coupled to the output of the frequency multiplier 232 of the main transmit module 224. The transmitter module 220 functions to amplify and frequency multiply the signal output by the frequency multiplier 232 so as to produce a modulated carrier signal suitable for transmission to the satellite 104. As shown in FIG. 5, in one embodiment, the transmitter module 220 comprises an input buffer 233, a frequency multiplier 234, which multiplies the second intermediate frequency by a factor of 4, a bandpass filter 235 tuned to the frequency of the carrier signal and an amplifier 236, operated in the saturation mode, for amplifying the output of the frequency multiplier 234 of the transmitter module 220, which are all coupled in a series configuration. Furthermore, in the preferred embodiment, the transmitter module 220 is formed as a single integrated circuit assembly.

As stated, in the preferred embodiment, the modulation scheme utilized to generate the modulated data signal creates a signal having a constant envelope amplitude so as to allow for the use of a saturated amplifier 236. For example, a minimum shift keying (MSK) technique can be utilized to modulate the data signals in the indoor unit 160. The minimum shift keying modulation technique provides a modulated carrier signal having a constant amplitude envelope and a continuous phase waveform. As a result, only the phase of the carrier signal is modulated and a high power non-linear amplifier (i.e., saturated) can be utilized to amplify the modulated carrier signal.

As shown in FIG. 5, the transmitter module 220 also comprises a control line 265 which either enables or disables the transmitter module 220 from generating a modulated carrier signal. For example, in the present embodiment, the control line 265 either couples or isolates the input buffer 233 and the amplifier 236 from a power supply in accordance with the signals received by the control and sequencing unit 231, as discussed above.

Returning to FIG. 4, the output of the transmitter module 220 is coupled to the TRIA assembly 226 via a waveguide, and subsequently to the antenna 120 which is coupled to the output of the TRIA assembly 226. The modulated carrier signal is transmitted to the satellite 104 via this transmission chain.

The TRIA assembly 226 also receives downlink signals from the antenna 120. These downlink signals have a different polarization than the modulated carrier signal produced by the transmitter module 220 and are prevented from entering the transmitter module 220 by the TRIA assembly 226. The TRIA assembly 226 does however couple the downlink signals to the low noise block downconverter 228 which downconverts the incoming signal to an intermediate frequency. The downconverted signal is coupled to the multiplexer 222 and then transferred to the indoor unit 160 via the interfacility link 13.

The apparatus of the present invention provides numerous advantages. For example, by down-converting the modulated reference signal output by the modulator, the frequency deviation of the modulated reference signal is also reduced by the same factor. As such, inexpensive modulators operating in the microwave region can be utilized.

Another advantage obtained by the down-conversion of the modulated reference signal is that any error in the I/Q balance of the input data signals to the modulator is also reduced by the same factor.

Yet another advantage is that the present invention increases the frequency of the output signal of the DDS without increasing the phase noise or spurious frequency components of the DDS signal. As stated above, this is accomplished by utilizing frequency translation in the feedback loop of the phase-locked loop contained in the signal generator.

In addition, the design of the transmitter module of the present invention results in an increase in operational efficiency of the outdoor unit, a reduction in overall size of the outdoor unit and a reduction in DC power consumption by the outdoor unit, which substantially lowers the cost of the outdoor unit of the present invention.

Numerous variations of the foregoing invention are also possible. For example, while the operational frequencies described above relate to the generation of a modulated signal having a nominal frequency of 111 MHz, the foregoing invention can be utilized to generate modulated signals having any desired frequency.

Of course, it should be understood that a wide range of other changes and modifications can be made to the preferred embodiment described above. It is therefore intended that the foregoing detailed description be regarded as illustrative rather than limiting and that it be understood that it is the following claims including all equivalents, which are intended to define the scope of the invention.

What is claimed is:

1. A VSAT system including an indoor unit and an outdoor unit:

said indoor unit comprising:
a quadrature modulator for phase and amplitude modulating a reference signal with an input information signal so as to produce a phase and amplitude modulated signal;
a frequency divider circuit coupled to the output of the quadrature modulator, the frequency divider circuit operative for reducing the frequency and frequency deviation of the phase and amplitude modulated signal, said frequency divider circuit outputting a phase-modulated signal having an envelope wherein the amplitude of the phase-modulated signal is fixed; and
a mixer coupled to the frequency divider circuit, the mixer operative for frequency translating the phase-modulated signal in accordance with a second reference signal and outputting a modulated data signal;

said outdoor unit comprising a phase-locked loop coupled to a transmitter module operative to receive said modulated data signal and to amplify and frequency multiply said modulated data signal by a predetermined factor so as to produce a modulated carrier signal having an envelope of fixed amplitude.

2. The VSAT system of claim 1, wherein said modulated carrier signal is in the Ku frequency band.

3. The VSAT system of claim 1, wherein said phase-locked loop multiplies said modulated data signal to an intermediate frequency and said transmitter module comprises a multiplier operative to frequency multiply said modulated data signal from said intermediate frequency to the frequency of said modulated carrier signal.

4. The VSAT system of claim 3, wherein said multiplier comprises a gallium arsenide FET.

5. The VSAT system of claim 3, wherein said transmitter module comprises a bandpass filter having an input port coupled to an output port of said multiplier, said bandpass filter tuned to the frequency of said modulated carrier signal.

6. The VSAT system of claim 5, wherein said transmitter module comprises a power amplifier operated in a saturation mode.

7. The VSAT system of claim 6, wherein said multiplier, said bandpass filter and said power amplifier are formed on a single integrated circuit.

8. The VSAT system of claim 3, wherein said phase-locked loop produces a lock-detect signal and said transmitter module includes a control circuit which disables the multiplier in response to the absence of said lock-detect signal.

9. The VSAT system of claim 1, wherein the phase and amplitude modulated signal is frequency divided, the phase-modulated signal is then frequency translated and the modulated data signal is then frequency multiplied without an increase in frequency deviation or phase noise.

10. The VSAT system of claim 1, wherein the indoor unit outputs a data transmission signal to said outdoor unit, said indoor unit dividing said data transmission signal by a magnitude N during generation of said data transmission signal, and said outdoor unit multiplies said data transmission signal by said magnitude N during generation of said modulated carrier signal.

11. A VSAT system including an indoor unit and an outdoor unit:

said indoor unit comprising:
by an I/Q modulator for phase and amplitude modulating a reference signal with an input information signal so as to produce a phase and amplitude modulated signal;
a frequency divider circuit coupled to the output of the I/Q modulator, the frequency divider circuit operative for reducing the frequency and frequency deviation of the phase and amplitude modulated signal, said frequency divider circuit outputting a phase-modulated signal having an envelope wherein the amplitude of the phase-modulated signal is fixed; and
a mixer coupled to the frequency divider circuit, the mixer operative for frequency translating the phase-modulated signal in accordance with a second reference signal and outputting a modulated data signal;

said outdoor unit comprising a phase-locked loop coupled to a transmitter module operative to receive said modulated data signal and to amplify and frequency multiply said modulated data signal by a predetermined factor so as to produce a modulated carrier signal having an envelope of fixed amplitude.

12. The VSAT system of claim 11, wherein said modulated carrier signal is in the Ku frequency band.

13. The VSAT system of claim 11, wherein said phase-locked loop multiplies said modulated data signal to an intermediate frequency and said transmitter module comprises a multiplier operative to frequency multiply said modulated data signal from said intermediate frequency to the frequency of said modulated carrier signal.

14. The VSAT system of claim 13, wherein said phase-locked loop produces a lock-detect signal and said transmitter module includes a control circuit which disables the multiplier in response to the absence of said lock-detect signal.

15. The VSAT system of claim 13, wherein said multiplier comprises a gallium arsenide FET.

16. The VSAT system of claim 13, wherein said transmitter module comprises a bandpass filter having an input port coupled to an output port of said multiplier, said bandpass filter tuned to the frequency of said modulated carrier signal.

17. The VSAT system of claim 16, wherein said transmitter module comprises a power amplifier operated in a saturation mode.

18. The VSAT system of claim 17, wherein said multiplier, said bandpass filter and said power amplifier are formed on a single integrated circuit.

19. The VSAT system of claim 11, wherein the phase and amplitude modulated signal is frequency divided, the phase-modulated signal is then frequency translated and the modulated data signal is then frequency multiplied without an increase In frequency deviation or phase noise.

20. The VSAT system of claim 11, wherein said indoor unit outputs a data transmission signal to said outdoor unit, said indoor unit dividing said data transmission signal by a magnitude N during generation of said data transmission signal, and said outdoor unit multiplies said data transmission signal by said magnitude N during generation of said modulated carrier signal.

21. A VSAT system comprising an indoor unit and an outdoor unit, said indoor unit operative for generating a low-phase-noise, low-spurious-frequency phase-modulated signal:

said indoor unit comprising:
a local oscillator for generating a reference signal;
a first phase-locked loop for frequency multiplying the reference signal by a first predetermined factor to generate a first signal of higher frequency than the reference signal;
a quadrature modulator for phase and amplitude modulating the first signal in accordance with iput I/Q data signals to produce a phase and amplitude modulated signal;
a frequency divider circuit coupled to an output of the quadrature modulator for reducing the frequency and frequency deviation of the phase and amplitude modulated signal by a second predetermined factor, said frequency divider circuit outputting the phase-modulated signal having an envelope wherein the amplitude of the phase-modulated signal is fixed;
a signal generator for generating a second signal; and
a mixer for frequency-translating the phase-modulated signal according to the frequency of the second signal and outputting a modulated data signal;

said outdoor unit comprising a phase-locked loop coupled to a transmitter module operative to receive said modulated data signal and to amplify and frequency multiply said modulated data signal by a third predetermined factor so as to produce a modulated carrier signal having an envelope of fixed amplitude.

22. The VSAT system of claim 21, wherein said phase-locked loop multiplies said modulated data signal to an intermediate frequency and said transmitter module comprises a multiplier operative to frequency multiply said modulated data signal from said intermediate frequency to the frequency of said modulated carrier signal.

23. The VSAT system of claim 22, wherein said multiplier comprises a gallium arsenide FET.

24. The VSAT system of claim 22, wherein said transmitter module comprises a bandpass filter having an input port coupled to an output port of said multiplier, said bandpass filter tuned to the frequency of said modulated carrier signal.

25. The VSAT system of claim 24, wherein said transmitter module comprises a power amplifier operated in a saturation mode.

26. The VSAT system of claim 25, wherein said multiplier, said bandpass filter and said power amplifier are formed on a single integrated circuit.

27. The VSAT system of claim 22, wherein said modulated carrier signal is in the Ku frequency band.

28. The VSAT system of claim 22, wherein said phase-locked loop produces a lock-detect signal and said transmitter module includes a control circuit which disables the multiplier in response to the absence of said lock-detect signal.

29. The VSAT system of claim 21, wherein the phase and amplitude modulated signal is frequency divided, the phase modulated signal is then frequency translated and the modulated data signal is then frequency multiplied without an increase in frequency deviation or phase noise.

30. The VSAT system of claim 21, wherein said indoor unit outputs a data transmission signal to said outdoor unit, said indoor unit dividing said data transmission signal by a magnitude N during generation of said data transmission signal, and said outdoor unit multiplies said data transmission signal by said magnitude N during generation of said modulated carrier signal.

31. A VSAT system comprising;
   a quadrature modulator for phase and amplitude modulating a reference signal with an input information signal so as to produce a phase and amplitude modulated signal;
   a frequency divider circuit coupled to the output of the quadrature modulator, the frequency divider circuit operative for reducing the frequency and frequency deviation of the phase and amplitude modulated signal, said frequency divider circuit outputting a phase-modulated signal having an envelope wherein the amplitude of the phase-modulated signal is fixed;
   a mixer coupled to the frequency divider circuit, the mixer operative for frequency translating the phase-modulated signal in accordance with a second reference signal and outputting a modulated data signal; and
   a phase-locked loop coupled to a transmitter module operative to receive said modulated data signal and to amplify and frequency multiply said modulated data signal by a predetermined factor so as to produce a modulated carrier signal having an envelope of fixed amplitude.

32. The VSAT system of claim 31, wherein the phase and amplitude modulated signal is frequency divided, the phase-modulated signal is then frequency translated and the modulated data signal is then frequency multiplied without an increase in frequency deviation or phase noise.

33. A VSAT system comprising:
   an I/Q modulator for phase and amplitude modulating a reference signal with an input information signal so as to produce a phase and amplitude modulated signal;
   a frequency divider circuit coupled to the output of the I/Q modulator, the frequency divider circuit operative for reducing the frequency and frequency deviation of the phase and amplitude modulated signal, said frequency divider circuit outputting a phase-modulated signal having an envelope wherein the amplitude of the phase-modulated signal is fixed;
   a mixer coupled to the frequency divider circuit, the mixer operative for frequency translating the phase-modulated signal in accordance with a second reference signal and outputting a modulated data signal; and
   a phase-locked loop coupled to a transmitter module operative to receive said modulated data signal and to amplify and frequency multiply said modulated data signal by a predetermined factor so as to produce a modulated carrier signal having an envelope of fixed amplitude.

34. The VSAT system of claim 33, wherein the phase and amplitude modulated signal is frequency divided, the phase-modulated signal is then frequency translated and the modulated data signal is then frequency multiplied without an increase in frequency deviation or phase noise.

35. A VSAT system operative for generating a low-phase-noise, low-spurious-frequency phase-modulated signal, said system comprising:
   a local oscillator for generating a reference signal;
   a first phase-locked loop for frequency multiplying the reference signal to generate a first signal of higher frequency than the reference signal;
   a quadrature modulator for phase and amplitude modulating the first signal in accordance with input I/Q data signals to produce a phase and amplitude modulated signal;
   a frequency divider circuit coupled to an output of the quadrature modulator for reducing the frequency and frequency deviation of the phase and amplitude modulated signal by a first predetermined factor, said frequency divider circuit outputting the phase-modulated signal having an envelope wherein the amplitude of the phase-modulated signal is fixed;
   a signal generator for generating a second signal;
   a mixer for frequency-translating the phase-modulated signal according to the frequency of the second signal and outputting a modulated data signal; and
   a phase-locked loop coupled to a transmitter module operative to receive said modulated data signal and to amplify and frequency multiply said modulated data signal by a second predetermined factor so as to produce a modulated carrier signal having an envelope of fixed amplitude.

36. The VSAT system of claim 35, wherein the phase and amplitude modulated signal is frequency divided, the phase-modulated signal is then frequency translated and the modulated data signal is then frequency multiplied without an increase in frequency deviation or phase noise.

37. A VSAT system including an indoor unit and an outdoor unit:
   said indoor unit comprising:
      a quadrature modulator for phase and amplitude modulating a reference signal with an input information signal so as to produce a phase and amplitude modulated signal;
      a frequency divider circuit coupled to the output of the quadrature modulator, the frequency divider circuit operative for reducing the frequency and frequency deviation of the phase and amplitude modulated signal by a first predetermined factor, said frequency divider circuit outputting a phase-modulated signal having an envelope wherein the amplitude of the phase-modulated signal is fixed; and
      a mixer coupled to the frequency divider circuit, the mixer operative for frequency translating the phase-modulated signal in accordance with a second reference signal and outputting a modulated data signal;
   said outdoor unit comprising a frequency multiplier coupled to an amplifier module operative to receive said modulated data signal and to amplify and frequency multiply said modulated data signal by a second predetermined factor so as to produce a modulated carrier signal having an envelope of fixed amplitude.

38. The VSAT system of claim 37, wherein said frequency multiplier comprises a gallium arsenide FET.

39. The VSAT system of claim 38, wherein said outdoor unit further comprises a bandpass filter having an input port coupled to an output port of said frequency multiplier, said bandpass filter tuned to the frequency of said modulated carrier signal.

40. The VSAT system of claim 39, wherein said amplifier module comprises a power amplifier operated in a saturation mode.

41. The VSAT system of claim 40, wherein said frequency multiplier, said bandpass filter and said power amplifier are formed on a single integrated circuit.

42. The VSAT system of claim 37, wherein said modulated carrier signal is in the Ku frequency band.

43. The VSAT system of claim 37, wherein the phase and amplitude modulated signal is frequency divided, the phase-modulated signal is then frequency translated and the modulated data signal is then frequency multiplied without an increase in frequency deviation or phase noise.

44. The VSAT system of claim 37, wherein said indoor unit outputs a data transmission signal to said outdoor unit, said indoor unit dividing said data transmission signal by a magnitude N during generation of said data transmission signal, and said outdoor unit multiplies said data transmission signal by said magnitude N during generation of said modulated carrier signal.

45. A VSAT system including an indoor unit and an outdoor unit:

said indoor unit comprising:
- an I/Q modulator for phase and amplitude modulating a reference signal with an input information signal so as to produce a phase and amplitude modulated signal;
- a frequency divider circuit coupled to the output of the I/Q modulator, the frequency divider circuit operative for reducing the frequency and frequency deviation of the phase and amplitude modulated signal by a predetermined factor, said frequency divider circuit outputting a phase-modulated signal having an envelope wherein the amplitude of the phase-modulated signal is fixed; and
- a mixer coupled to the frequency divider circuit the mixer operative for frequency translating the phase-modulated signal in accordance with a second reference signal and outputting a modulated data signal;

said outdoor unit comprising a frequency multiplier coupled to an amplifier module operative to receive said modulated data signal and to amplify and frequency multiply said modulated data signal by a second predetermined factor so as to produce a modulated carrier signal having an envelope of fixed amplitude.

46. The VSAT system of claim 45, wherein said frequency multiplier comprises a gallium arsenide FET.

47. The VSAT system of claim 45, wherein said outdoor unit further comprises a bandpass filter having an input port coupled to an output port of said frequency multiplier, said bandpass filter tuned to the frequency of said modulated carrier signal.

48. The VSAT system of claim 47, wherein said amplifier module comprises a power amplifier operated in a saturation mode.

49. The VSAT system of claim 48, wherein said frequency multiplier, said bandpass filter and said power amplifier are formed on a single integrated circuit.

50. The VSAT system of claim 45, wherein said modulated carrier signal is in the Ku frequency band.

51. The VSAT system of claim 45, wherein the phase and amplitude modulated signal is frequency divided, me phase-modulated signal is then frequency translated and the modulated data signal is then frequency multiplied without an Increase in frequency deviation or phase noise.

52. The VSAT system of claim 45, wherein said indoor unit outputs a data transmission signal to said outdoor unit, said indoor unit dividing said data transmission signal by a magnitude N during generation of said data transmission signal, and said outdoor unit multiplies said data transmission signal by said magnitude N during generation of said modulated carrier signal.

* * * * *